United States Patent [19]

Ashida et al.

[11] 3,882,411

[45] May 6, 1975

[54] LINEAR AMPLIFIER

[75] Inventors: Hideo Ashida, Yokohama; Yoshimasa Daido, Tokyo; Hidemitsu Komizo; Hiroyuki Suzuki, both of Kawasaki, all of Japan

[73] Assignee: Fujitsu Limited, Kawasaki, Japan

[22] Filed: Oct. 9, 1973

[21] Appl. No.: 404,322

[30] Foreign Application Priority Data

Oct. 12, 1972 Japan ............................ 47-102228

[52] U.S. Cl. ..................... 330/34; 330/53; 330/56; 330/61 A; 333/1.1

[51] Int. Cl. ............................................ H03f 3/10

[58] Field of Search ......... 330/34, 53, 54, 56, 61 A, 330/61 R; 333/1.1

[56] References Cited

UNITED STATES PATENTS

| | | | |
|---|---|---|---|
| 3,327,240 | 6/1967 | Grabowski | 330/34 X |
| 3,784,925 | 1/1974 | Chang et al. | 330/53 X |

*Primary Examiner*—R. V. Rolinec
*Assistant Examiner*—Lawrence J. Dahl
*Attorney, Agent, or Firm*—Daniel Jay Tick

[57] ABSTRACT

The gain and phase characteristic of a negative resistance amplifier circuit is linearized by controlling the bias current of an avalanche diode of the negative resistance amplifier circuit in accordance with the amplitude of the input signal.

9 Claims, 8 Drawing Figures

REFLECTION TYPE NEGATIVE RESISTANCE AMPLIFIER

LINEAR AMPLIFIER

BACKGROUND OF THE INVENTION

1. Field of the Invention

The present invention relates to a linear amplifier. More particularly, the invention relates to a negative resistance amplifier circuit including an avalanche diode and having a linear amplification characteristic.

2. Description of the Prior Art

As is well known, the input/output characteristic and phase characteristic of a negative resistance amplifier circuit including an avalanche diode are non-linear. For this reason, amplifiers of this type have been used as carrier signal amplifiers for signals of a single frequency and a constant amplitude. This type of amplifier has not been used to amplify amplitude modulated signals. More particularly, it is a serious disadvantage that the output signal is distorted by a non-linear amplification characteristic when a negative resistance amplifier circuit having an avalanche diode is utilized as an amplifier for amplitude modulated signals.

The principal object of the invention is to provide a linear amplifier having a linear gain and phase characteristic.

An object of the invention is to provide a negative resistance amplifier circuit including an avalanche diode and having a linear input/output characteristic and a constant gain.

Another object of the invention is to provide a negative resistance amplifier circuit having an avalanche diode, which amplifier has reduced phase difference between the input and output signals, reduced crosstalk modulation produced by AM-PM conversion, and a greatly improved amplification characteristic of amplitude modulated signals.

BRIEF SUMMARY OF THE INVENTION

In accordance with the invention, a linear amplifier having a negative resistance amplifier circuit including an avalanche diode comprises an input for supplying an input signal to the negative resistance amplifier circuit. A coupling is coupled to the input for diverging part of the input signal. A detector is connected to the coupling for detecting the part of the input signal. A circuit is connected between the detector and the negative resistance amplifier circuit for supplying a bias current to the avalanche diode of the negative resistance amplifier circuit and for controlling the bias current in accordance with the amplitude of the detected input signal voltage. An output is coupled to the negative resistance amplifier circuit for providing an output signal.

The circuit comprises an adder having two inputs and an output, a source of bias current connected to one of the inputs of the adder, means connecting the other input of the adder to the detector and means connecting the output of the adder to the avalanche diode of the negative resistance amplifier circuit.

The negative resistance amplifier circuit may be a reflection type amplifier circuit or a transparent type amplifier circuit.

The input signal may be an amplitude modulated signal or a frequency modulated signal.

The coupling comprises a directional coupler. A frequency converter is connected between the coupling and the negative resistance amplifier circuit. The reflection type amplifier circuit comprises a circulator and a negative resistance amplifier.

BRIEF DESCRIPTION OF THE DRAWINGS

In order that the invention may be readily carried into effect, it will now be described with reference to the accompanying drawings, wherein.

In the FIGS., the same components are identified by the same reference numerals.

DETAILED DESCRIPTION OF THE INVENTION

Figure 1:
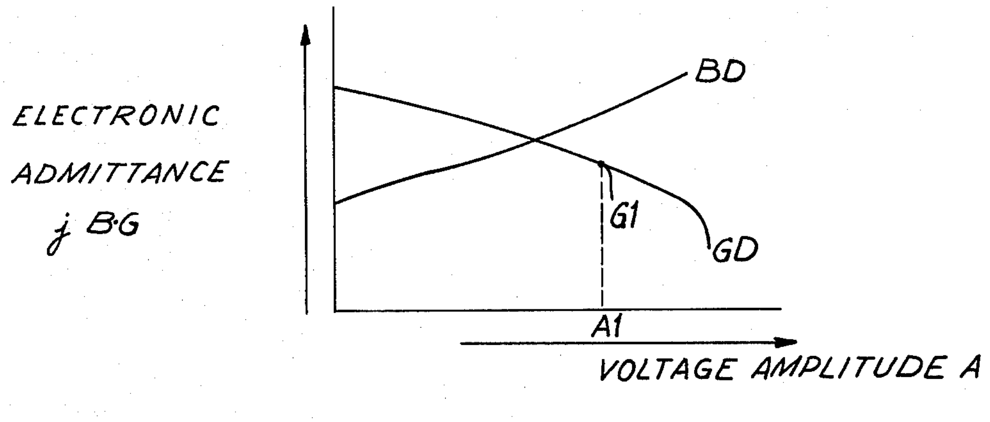
FIG. 1 is a graphical presentation of the relation between the electronic admittance of a typical avalanche diode and the high frequency voltage amplitude applied to the avalanche diode.

FIG. 1 shows the relation between the electronic admittance of a typical avalanche diode and a high frequency voltage amplitude applied to the avalanche diode. In FIG. 1, the abscissa represents high frequency voltage amplitude and the ordinate represents the electronic admittance of the avalanche diode. From FIG. 1, it is apparent that the conductance and susceptance of the avalanche diode have non-linear characteristics at the high frequency voltage amplitudes applied to the avalanche diode. The power gain $G(\omega,A)$ of the avalanche diode may be expressed as follows when it is adapted to a reflection type negative resistance amplifier circuit.

$$G(\omega,A) = \frac{\overset{*}{YL}(\omega) - YD(A)}{YL(\omega) + YD(A)} \quad (1)$$

In Equation (1), $\omega$ represents the frequency $A$ represents the high frequency voltage amplitude applied to the avalanche diode $YL(\omega)$ represents the locus of the load admittance $YD(A)$ represents the electronic admittance

* indicates a conjugate complex number

Here, the electronic admittance $YD(A)$ of the avalanche diode may be expressed as follows.

$$YD(A) = -GD(A) + jBD(A) \quad (2)$$

wherein $GD(A)$ represents the conductance $BD(A)$ represents the susceptance.

In Equation (2), the frequency characteristics of the conductance and susceptance are ignored, since they are so small as to be negligible, compared with the amplitude characteristics.

The conductance $GD(A)$ and susceptance $BD(A)$, as shown in FIG. 1, depend entirely on the high frequency voltage amplitude applied to the avalanche diode and exhibit a descending and ascending characteristic, respectively.

In FIG. 1, when it is assumed that the conductance of the avalanche diode operating at the high frequency voltage amplitude applied thereto at the point $A1$ is $G1$, the power $P1$ produced by the avalanche diode may be expressed by the following equation.

$$P1 = \tfrac{1}{2}\, G1\, A1^2 \qquad (3)$$

Furthermore, when the input signal power and the output signal power of a reflection type negative resistance amplifier circuit are indicated by $Pi$ and $Po$, respectively $$Po = G(\omega,A) \cdot Pi \qquad (4)$$

and $$Po = Pi + Pl \qquad (5)$$

Therefore, the Equation (6) may be obtained from Equations (3), (4) and (5).

$$[G(\omega,A) - 1] \cdot Pi = \tfrac{1}{2}\, G1\, A1^2 \qquad (6)$$

From Equation (6), it is obvious that the high frequency voltage amplitude $A$ impressed on the avalanche diode varies with the value of the input signal power $Pi$. Thus, the power gain $G(\omega,A)$ is truly varied in dependence upon the input signal power $Pi$.

Moreover, the phase difference $\phi$ between the input and output signal may be obtained as follows. That is, since the electronic admittance of the avalanche diode is expressed as $YD(A) = -GD(A) + jBD(A)$ and the load admittance, $YL(\omega) = GL(\omega) + jBL(\omega)$, although $GL(\omega)$ represents the load conductance and $BL(\omega)$ represents the load susceptance, the power gain $G(\omega,A)$ may be given as follows.

$$G(\omega,A) = \left| \frac{YL^*(\omega) - YD(A)}{YL(\omega) + YD(A)} \right| = \left| \frac{GL(\omega) - jBL(\omega) + GD(A) - jBD(A)}{GL(\omega) + jBL(\omega) - GD(A) + jBD(A)} \right| = \left| \frac{(GL(\omega) + GD(A)) - j(BL(\omega) + BD(A))}{(GL(\omega) - GD(A)) + j(BL(\omega) + BD(A))} \right| \qquad (7)$$

Therefore, the phase difference $\phi$ between the input and the output is as follows.

$$\phi = \phi o - \tan^{-1} \frac{BL(\omega)+BD(A)}{GL(\omega)+GD(A)} - \tan^{-1} \frac{BL(\omega)+BD(A)}{GL(\omega)-GD(A)} \qquad (8)$$

In Equation (8), $\phi o$ is the initial phase. Equation (8) proves that the phase difference $\phi$ between the input and the output also varies with the values of the input signal power.

Figure 2:
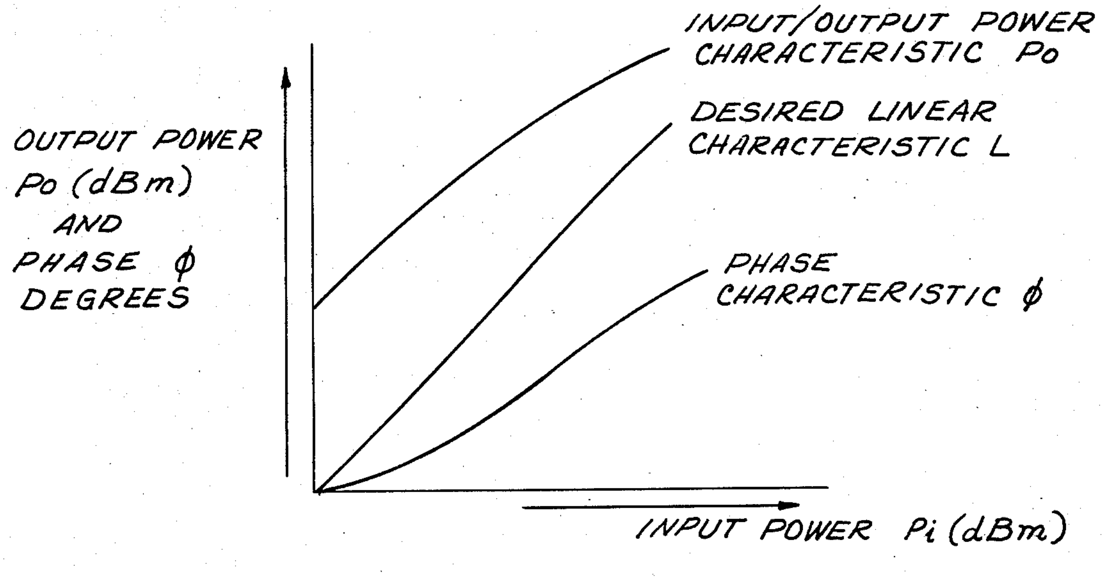
FIG. 2 is a graphical presentation of the input/output power characteristic and the phase characteristic of a negative resistance amplifier circuit obtained by applying a constant bias current to an avalanche diode included in the amplifier circuit.

The input/output characteristic and the phase characteristic obtained when a constant bias current is supplied to the avalanche diode of the negative resistance amplifier circuit used in the same manner as before are shown in FIG. 2. In FIG. 2, the abscissa represents the input power and the ordinate represents the output power and the phase of the avalanche diode. As shown in FIG. 2, the input/output power characteristic Po has a non-linear saturation characteristic and the phase characteristic $\phi$ also has a non-linear characteristic in the high input power range of the avalanche diode. In addition, the non-linear characteristic is obvious, compared with the desirable linear characteristic L of the linear amplifier, and the gradient angle is reduced. The desired linear characteristic L is at a 45° slope. Therefore, if an avalanche diode having such non-linear input/output characteristic is used as an amplitude modulated linear amplifier or if an avalanche diode having such phase characteristic is used as a frequency modulated linear amplifier, it is obvious that satisfactory linearity cannot be obtained.

The principle and embodiment of the linear amplifier of the present invention are hereinafter described in detail.

Figure 3:
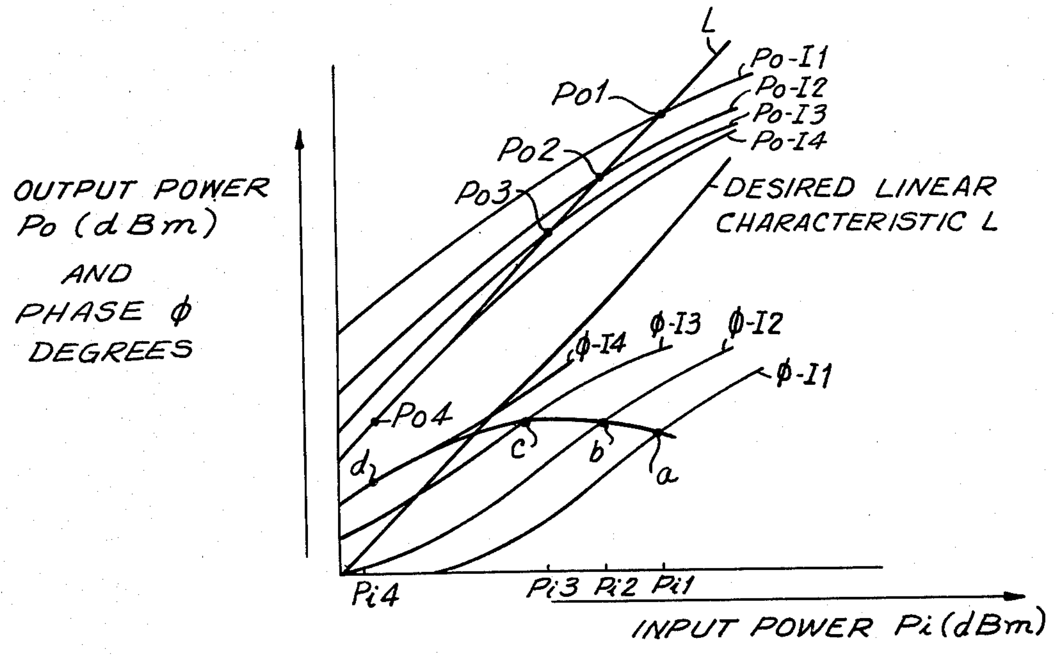
FIG. 3 is a graphical presentation of the input/output power characteristics and the phase characteristics of a negative resistance amplifier circuit obtained by applying different bias currents to an avalanche diode included in the amplifier circuit.

The input/output characteristic and phase characteristic of FIG. 2, vary greatly when the operating current varies with the variations of the bias current supplied to the avalanche diode. In other words, when the operating currents I1 to I4 are plotted as the parameters, the input/output characteristic and the phase characteristic vary like Po-I1 to I4 and $\phi$-I1 to I4 as they move in parallel upward and downward. If it is assumed that the output powers at the points where the straight line L′, with a constant gain in parallel with the line L having a slope or gradient angle of 45°, cross the input/output characteristic Po-I1 to I4 are PO1 to PO4, the input powers at such times are Pi1 to Pi4, and the phases corresponding to these input powers are $a$ to $d$, the variations of the phase become very little, as shown in FIG. 3. Therefore, by providing the characteristic the characteristic shown in FIG. 4, of, for example, the operating current I of the avalanche diode against the input power Pi, the characteristic coincides with the characteristic obtained by plotting the points PO1, PO2, PO3 and PO4 of FIG. 3, that is, the line L′ with a constant gain. At such time, the phase characteristic with extremely small variations plotted by the points $a$, $b$, $c$ and $d$ may be obtained, thus providing an optimum characteristic for the linear amplifier.

Figure 4:
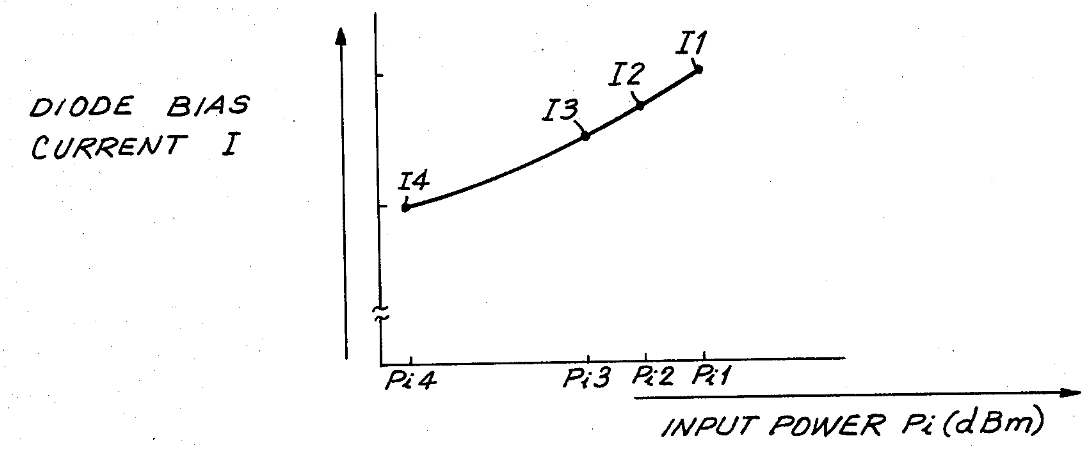
FIG. 4 is a graphical presentation of the relation between the operating bias current and the input power of an avalanche diode.

In FIG. 3, the abscissa represents the input power and the ordinate, represents the output power and the phase of the avalanche diode. In FIG. 4, the abscissa represents the input power and the ordinate represents the avalanche diode bias current I.

Although the foregoing explanation is primarily for an amplitude modulated linear amplifier, it is also possible to provide linearity to the phase characteristic of a frequency modulated amplifier in the same manner.

Figure 5:
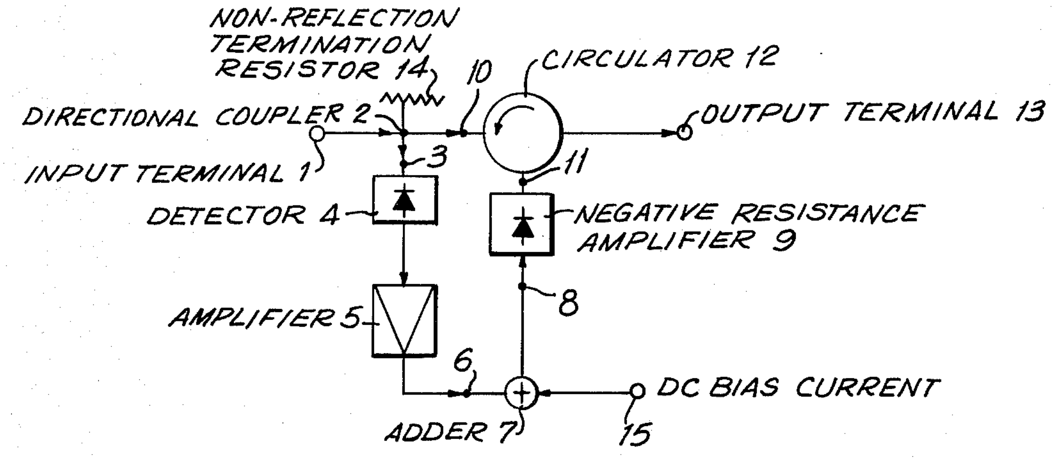
FIG. 5 is a block diagram of an embodiment of the linear amplifier of the invention.

FIG. 5 is an embodiment of the linear amplifier of the invention based on the aforedescribed principle.

In FIG. 5, the input signal at an input terminal 1 is supplied to a terminal 10 of a circulator 12 via a directional coupler 2. On the other hand, part of the input signal is supplied to a detector 4 from the directional coupler 2 via a terminal 3. The output of the detector 4 is amplified by an amplifier 5 and supplied to an adder 7 via a terminal 6. At the adder 7, the input signal from the terminal 6 is superimposed on a DC bias current supplied from a terminal 15.

The output of the adder 7 is supplied as the bias of a negative resistance amplifier 9 including an avalanche diode via a terminal 8. The negative resistance amplifier 9 is preferably a reflection type negative resistance amplifier. The input signal at the terminal 10 of the circulator 12 is supplied as an input to the negative resistance amplifier, 9 via a terminal 11, amplified and an output signal is supplied to an output terminal 13 via the terminal 11 and the circulator 12. A non-reflection termination resistor 14 is connected to another terminal of the directional coupler 2. The negative resistance amplifier circuit comprises the circulator 12 and the negative resistance amplifier 9.

Figure 6:
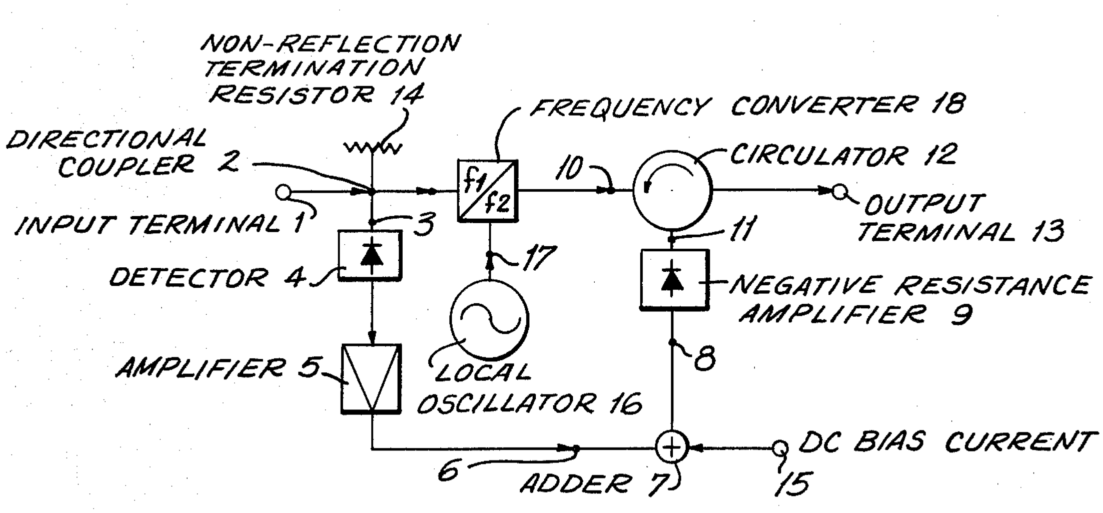
FIG. 6 is a block diagram of another embodiment of the linear amplifier of FIG. 5.

FIG. 6 shows another embodiment of the linear amplifier of the invention. In the circuit of FIG. 6, the input signal is supplied to a frequency converter 18 for up and down conversions via the directional coupler 2 and a terminal 19. The signal which has completed the frequency conversion is fed to the terminal 10 of the circulator 12. The output oscillation of a local oscillator 16 is supplied to the frequency converter 18 via a terminal 17. The frequency converter 18 provides an output signal of frequency $f1 + f2$ or $f1 - f2$ when the frequency of the input signal at the terminal 15 is $f1$ and the signal at the terminal 17 $f2$. The remainder of the circuit of FIG. 6 is exactly the same as that of FIG. 5.

Since the control voltage supplied to the adder 7 in FIG. 6 is extracted from the input signal before entering into the frequency converter 18, the power of the extracted control voltage is greater than that obtained when the control voltage is extracted from an input signal which has passed through said frequency converter. This is an excellent advantage of the linear amplifier of the invention.

Figure 7:
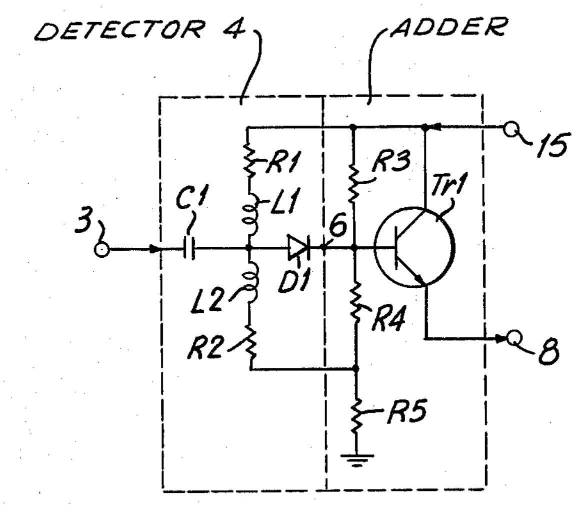
FIG. 7 is a circuit diagram of the detector 4 and adder 7 of the linear amplifier of the invention.

FIG. 7 shows a circuit of the detector 4 and the adder 7 of FIGS. 5 and 6. The amplifier 5 is omitted.

In FIG. 7, part of the input signal supplied via the terminal 3 (FIGS. 5 and 6) passes a DC blocking capacitor C1, is detected by a diode D1 and is supplied as the input to the base electrode of a transistor Tr1. Since a DC bias current is applied to the base electrode of the transistor Tr1. from the terminal 15, the emitter current of said transistor varies with the detection voltage of the diode D1. Furthermore, high frequency blocking chokes L1 and L2 are connected to a common point in the connection between the blocking capacitor C1 and the diode D1. A resistor R1, which is a bias resistor of the diode D1, is connected between the choke L1 and the terminal 15 (FIGS. 5 and 6). A resistor R2 and a resistor R5, which are bias resistors of the diode D1, are connected in series between the choke L2 and a point at ground potential.

A resistor R3, which is a bias resistor of the transistor Tr1, is connected between the base electrode of said transistor and the terminal 15. A resistor R4 and the resistor R5, which are bias resistors of the transistor Tr1, are connected in series between the base electrode of said transistor and a point at ground potential. The resistor R2 is connected to a common point in the connection of the resistors R4 and R5. The terminals 3, 8 and 15 are the same as those of FIGS. 5 and 6; the terminal 8 being connected to the avalanche diode of the reflection type negative resistance amplifier 9 (FIGS. 5 and 6).

Figure 8:
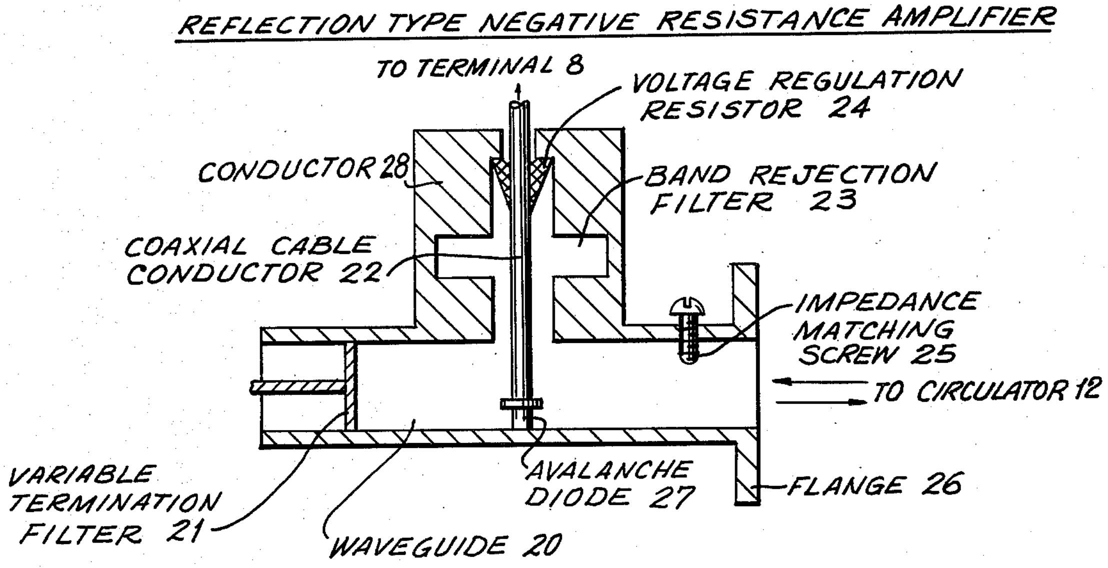
FIG. 8 is a schematic diagram, partly in section, of an embodiment of the reflection type negative resistance amplifier 9 of the invention.

FIG. 8 shows an embodiment of a reflection type negative resistance amplifier circuit. The amplifier of FIG. 8 comprises a waveguide 20, a variable termination resistor 21, a conductor 22 of a coaxial cable, a band rejection filter 23, a voltage regulation resistor 24, an impedance matching screw 25, a flange 26 of the waveguide 20, an avalanche diode 27 and a conductor 28 outside the coaxial cable.

In the reflection type negative resistance amplifier circuit of FIG. 8, the high frequency signal from the circulator is supplied as an input at the right end of the waveguide 20, amplified, reflected at the mount section of the avalanche diode 27, and is returned to the circulator via the right end of said waveguide. The bias of the avalanche diode 27 is provided by the conductor 22 of the coaxial cable. In other words, the emitter current output terminal 8 of the transistor Tr1 of FIG. 7 is connected to the conductor 22 of the coaxial cable of FIG. 8.

Although the foregoing explanation is for an amplitude modulation amplifier of the reflection type negative resistance type having an avalanche diode, it is obvious that the invention may be applied to a negative resistance amplifier of transparent type. In addition, the invention may naturally be applied to a frequency modulation amplifier as hereinbefore mentioned. Furthermore, the concept of the invention may be applied to a frequency converter which includes, for example, a varactor diode or mixer diode having a non-linear characteristic for the input level, in place of the avalanche diode.

Each of the components of the linear amplifier of the invention, including the directional coupler 2, the circulator 12, the negative resistance amplifier 9, the amplifier 5, the frequency converter 18 and the oscillator 16, is known and may comprise any suitable equipment known in the art. These components are described, for example, in the Digest of Technical Papers, 1972 IEEE International Solid-State Circuits Conference, Feb. 16, 1972, pages 36 and 37, H. Komizo, et al., "A 0.5-W CW IMPATT Diode Amplifier for High-Capacity 11-G Hz FM Radio-Relay Equipment."

While the invention has been described by means of specific examples and in specific embodiments, we do not wish to be limited thereto, for obvious modifications will occur to those skilled in the art without departing from the spirit and scope of the invention.

We claim:

1. A linear amplifier having a negative resistance amplifier circuit including an avalanche diode, said linear amplifier comprising input means for supplying an input signal to the negative resistance amplifier circuit;

coupling means coupled to the input means for diverging part of the input signal;

detector means connected to the coupling means for detecting the part of the input signal;

circuit means connected between the detector means and the negative resistance amplifier circuit for supplying a bias current to the avalanche diode of the negative resistance amplifier circuit and for controlling the bias current in accordance with the amplitude of the detected input signal voltage; and output means coupled to the negative resistance amplifier circuit for providing an output signal.

2. A linear amplifier as claimed in claim 1, wherein the circuit means comprises an adder having two inputs and an output, a source of bias current connected to one of the inputs of the adder, means connecting the other input of the adder to the detector and means connecting the output of the adder to the avalanche diode of the negative resistance amplifier circuit.

3. A linear amplifier as claimed in claim 1, wherein the coupling means comprises a directional coupler.

4. A linear amplifier as claimed in claim 1, wherein the negative resistance amplifier circuit is a reflection type amplifier circuit.

5. A linear amplifier as claimed in claim 1, wherein the negative resistance amplifier circuit is a transparent type amplifier circuit.

6. A linear amplifier as claimed in claim 1, wherein the input signal is an amplitude modulated signal.

7. A linear amplifier as claimed in claim 1, wherein the input signal is a frequency modulated signal.

8. A linear amplifier as claimed in claim 1, further comprising a frequency converter connected between the coupling means and the negative resistance amplifier circuit.

9. A linear amplifier as claimed in claim 5, wherein the reflection type amplifier circuit comprises circulator means and a negative resistance amplifier.

* * * * *